(12) United States Patent
Take et al.

(10) Patent No.: US 12,288,646 B2
(45) Date of Patent: Apr. 29, 2025

(54) CAPACITOR WITH CONNECTION CONDUCTOR CONTACTING A SURFACE OF A SUBSTRATE

(71) Applicant: TAIYO YUDEN CO., LTD., Tokyo (JP)

(72) Inventors: Yoshinari Take, Tokyo (JP); Yoshio Aoyagi, Tokyo (JP); Hidetoshi Masuda, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 390 days.

(21) Appl. No.: 17/762,536

(22) PCT Filed: Sep. 28, 2020

(86) PCT No.: PCT/JP2020/036515
§ 371 (c)(1),
(2) Date: Mar. 22, 2022

(87) PCT Pub. No.: WO2021/060552
PCT Pub. Date: Apr. 1, 2021

(65) Prior Publication Data
US 2022/0384113 A1      Dec. 1, 2022

(30) Foreign Application Priority Data
Sep. 27, 2019  (JP) .................... 2019-176951

(51) Int. Cl.
*H10D 1/00* (2025.01)
*H01G 4/252* (2006.01)
(Continued)

(52) U.S. Cl.
CPC .......... *H01G 4/252* (2013.01); *H01G 4/306* (2013.01); *H01G 4/33* (2013.01); *H10D 1/043* (2025.01);
(Continued)

(58) Field of Classification Search
CPC .......... H01G 4/252; H01G 4/306; H01G 4/33; H01G 4/008; H01G 4/012; H01G 4/1236;
(Continued)

(56) References Cited

U.S. PATENT DOCUMENTS 4,682,204 A * 7/1987 Shiozaki ............ H01L 23/5256
                                                              257/E23.149
4,908,692 A * 3/1990 Kikuchi ................ H01L 23/62
                                                              257/E23.149
(Continued)

FOREIGN PATENT DOCUMENTS

CN      111989850 A   * 11/2020 .......... H01L 27/0682
JP      2009-515353 A    4/2009
(Continued)

OTHER PUBLICATIONS

Notice of Reasons for Refusal dated Oct. 24, 2023, issued in corresponding Japanese Patent Application No. 2019-176951 with English translation (12 pgs.).

(Continued)

*Primary Examiner* — Jesse Y Miyoshi
*Assistant Examiner* — Andrew Chung
(74) *Attorney, Agent, or Firm* — Pillsbury Winthrop Shaw Pittman, LLP

(57) ABSTRACT

A capacitor that can make a failure mode into an open mode even when a short circuit caused by insulation breakdown occurs in a dielectric layer is provided. The capacitor includes: a substrate; an MIM structure disposed on the Substrate, the MIM structure including a dielectric layer, a bottom electrode layer disposed on one side of the dielectric layer and composed of a first conductive material, and a top electrode layer disposed on the other side of the dielectric layer; a first external electrode disposed on the substrate; a second external electrode disposed on the substrate; and a (Continued)

connection conductor connecting between the bottom electrode layer and the first external electrode, the connection conductor including a first contact portion contacting the substrate.

14 Claims, 15 Drawing Sheets

(51) Int. Cl.
*H01G 4/30* (2006.01)
*H01G 4/33* (2006.01)
*H10D 1/68* (2025.01)
*H01G 4/008* (2006.01)
*H01G 4/012* (2006.01)
*H01G 4/12* (2006.01)

(52) U.S. Cl.
CPC ............. *H10D 1/716* (2025.01); *H01G 4/008* (2013.01); *H01G 4/012* (2013.01); *H01G 4/1236* (2013.01)

(58) Field of Classification Search
CPC ...... H01L 28/90–92; H01D 1/042–043; H01D 1/716
See application file for complete search history.

(56) References Cited

U.S. PATENT DOCUMENTS

| | | | |
|---|---|---|---|
| 10,964,474 B2* | 3/2021 | Matsuo | H01G 4/33 |
| 2008/0291601 A1 | 11/2008 | Roozeboom et al. | |
| 2009/0109582 A1* | 4/2009 | Jack | H01L 23/62 |
| | | | 257/E27.001 |
| 2010/0052099 A1* | 3/2010 | Chang | H01L 23/642 |
| | | | 257/E29.342 |
| 2013/0026541 A1 | 1/2013 | Kurokawa et al. | |
| 2014/0145299 A1 | 5/2014 | Kalnitsky et al. | |
| 2015/0305159 A1 | 10/2015 | Yamamoto et al. | |
| 2016/0020267 A1 | 1/2016 | Lin | |
| 2016/0284694 A1 | 9/2016 | Chou et al. | |
| 2017/0053979 A1 | 2/2017 | Voiron et al. | |

FOREIGN PATENT DOCUMENTS

| | | |
|---|---|---|
| JP | 2013-026540 A | 2/2013 |
| JP | 2017-513218 A | 5/2017 |
| WO | 2014/069363 A1 | 5/2014 |

OTHER PUBLICATIONS

International Search Report dated Dec. 15, 2020, issued in corresponding International Patent Application No. PCT/JP2020/036515 w/English translation (5 pgs.).

* cited by examiner

CAPACITOR WITH CONNECTION CONDUCTOR CONTACTING A SURFACE OF A SUBSTRATE

CROSS-REFERENCE TO RELATED APPLICATIONS

This application is the U.S. National Phase of International Application No. PCT/JP2020/036515, filed Sep. 28, 2020, which is based on and claims the benefit of priority from Japanese Patent Application Serial No. 2019-176951 (filed on Sep. 27, 2019), the contents of each of which are hereby incorporated by reference in their entirety. The present invention relates to a capacitor.

Technical Field

Background

There is a known thin film capacitor including an MIM structure formed by a thin film process, the thin film capacitor being configured to create a capacitance by the MIM structure. The thin film capacitor is required to increase a capacitance created per unit area for its downsizing or high capacitance.

A trench capacitor has been known as a capacitor which can increase a capacitance per unit area. The trench capacitor has a substrate formed with trenches, in which an MIM structure for creating a capacitance is embedded. The MIM structure is a laminate in which a dielectric layer composed of dielectric material and an electrode layer composed of a conductor are stacked one after the other. The trench capacitor includes a dielectric layer and a conductor layer on side surfaces of a trench extending in a thickness direction of the substrate, thereby increasing a capacitance per unit area. Such a known trench capacitor is disclosed, for example, in Patent Literature 1 to Patent literature 3.

LIST OF RELEVANT PATENT LITERATURES

[Patent Literature 1] U.S. Patent Application Publication No. 2016/0020267
[Patent Literature 2] U.S. Patent Application Publication No. 2016/0284694
[Patent Literature 3] U.S. Patent Application Publication No. 2014/0145299

SUMMARY

Insulation breakdown sometimes occurs in a dielectric layer between electrode layers of the trench capacitor. For example, when a defect was made in the dielectric layer at the time of manufacturing or the dielectric layer has deteriorated, the part having such a defect or deterioration is subjected to insulation breakdown. When insulation breakdown occurs in the dielectric layer, Joule heat is generated by a current flowing through the damaged part to cause electrode layers to melt by the Joule heat and flow around the damaged part. Due to the flow of the melted electrode layers, the electrode layers disposed on both sides of the dielectric layer are short-circuited. Therefore, a failure mode in a trench capacitor is typically a short mode.

When a failure occurs in a trench capacitor in a short mode, a current that is not applied under ordinary circumstances, namely an excess current, is applied to constituent components of a circuit connected to the trench capacitor. Such application of a current that is not expected under ordinary circumstances causes malfunctioning or destruction of the circuit. In order to prevent the unwanted application of a current to the other circuit, it is desirable that the trench capacitor has an open mode as a failure mode.

One object of the present disclosure is to provide a capacitor that can make a failure mode into an open mode even when a short circuit caused by insulation breakdown occurs in a dielectric layer. Other objects of the present disclosure will be apparent with reference to the entire description in this specification.

The capacitor according to one embodiment of the present invention comprises: an Si substrate; an MIM structure disposed on the Si substrate, the MIM structure including a first dielectric layer, a first electrode layer disposed on one side of the first dielectric layer and composed of a first conductive material, and a second electrode layer disposed on the other side of the first dielectric layer; a first external electrode disposed on the Si substrate; a second external electrode disposed on the Si substrate; and a connection conductor connecting between the first electrode layer and the first external electrode, the connection conductor including a contact portion contacting the Si substrate.

The connection conductor of the capacitor includes a contact portion contacting the Si substrate. When a short circuit caused by insulation breakdown occurs in the MIM structure, the connection conductor is heated and melted by an excess current. Since the connection conductor includes the contact portion, the melted second conductive material spreads in the Si substrate near the contact portion. This allows the connection conductor to be disconnected near the contact portion to break an electrical connection between the MIM structure and the first external electrode. Accordingly, even when a short circuit caused by insulation breakdown occurs, the failure mode can be made into an open mode.

In one embodiment of the present invention, the connection conductor may be composed of a second conductive material having a lower melting point than the first conductive material. With this structure, when a short circuit caused by insulation breakdown occurs in the MIM structure, the connection conductor is easy to be melted by an excess current. Accordingly, it is possible to disconnect the connection conductor near the contact portion in a more reliable manner and make the failure mode into an open mode in a more reliable manner even when a short circuit caused by insulation breakdown occurs.

In one embodiment of the present invention, the second conductive material may be aluminum. Since aluminum is easy to spread in the Si substrate, the connection conductor can be disconnected near the contact portion in a more reliable manner when a short circuit caused by insulation breakdown occurs in the MIM structure. Accordingly, it is possible to make the failure mode into an open mode in a more reliable manner even when a short circuit caused by insulation breakdown occurs.

In one embodiment of the present invention, plural trenches may be disposed on a surface of the Si substrate, and the MIM structure may be disposed on the Si substrate so as to be embedded in at least one of the plural trenches. With this structure, it is possible to increase an electrostatic capacitance of the capacitor while keeping its dimension.

In one embodiment of the present invention, a cross section of the connection conductor in a direction perpendicular to a current pathway from the first electrode layer to the first external electrode may be smallest at the contact portion. With this structure, the contact portion is easy to be heated when an excess current flows through the connection conductor. This allows the second conductive material to be easily melted particularly at the contact portion. Accordingly, it is possible to disconnect the connection conductor near the contact portion in a more reliable manner and make the failure mode into an open mode in a more reliable manner even when a short circuit caused by insulation breakdown occurs.

In one embodiment of the present invention, the plural trenches may include at least one empty trench in which the MIM structure is not embedded, and the at least one empty trench may be at least partially covered by the contact portion. With this structure, the second conductive material melted by an excess current flowing through the connection conductor flows into the empty trench, and therefore, the connection conductor can be disconnected near the contact portion in a more reliable manner. Accordingly, it is possible to make the failure mode into an open mode in a more reliable manner even when a short circuit caused by insulation breakdown occurs.

In one embodiment of the present invention, a depth-direction dimension of the empty trench may be smaller than a depth-direction dimension of the other trench in which the MIM structure is embedded.

In one embodiment of the present invention, the capacitor further comprises a lead-out electrode connecting between the second electrode layer and the second external electrode, the lead-out conductor composed of a third conductive material having a lower melting point than the first conductive material.

In one embodiment of the present invention, the lead-out conductor may be disposed without contacting the Si substrate.

In one embodiment of the present invention, the connection conductor may be provided in plural, the MIM structure may include plural sections connected in parallel to each other, and the connection conductor may be disposed at each of the plural sections. With this structure, when a short circuit caused by insulation breakdown occurs in the MIM structure, only the connection conductor disposed at a section having the short circuit can be disconnected. Accordingly, it is possible to reduce variation in an electrostatic capacitance of the capacitor due to the failure.

In one embodiment of the present invention, the MIM structure may further include a second dielectric layer disposed on the second electrode layer and a third electrode layer disposed on the second dielectric layer, and the capacitor may further comprise another connection conductor connecting between the third electrode layer and the first external electrode, the other connection conductor composed of the second conductive material having a lower melting point than a material composing the third electrode layer. With this structure, only the connection conductor connected the electrode layer having a short circuit, and therefore, it is possible to reduce variation in an electrostatic capacitance of the capacitor due to the failure.

One embodiment of the present invention relates to a circuit board comprising any one of the above-described capacitors.

One embodiment of the present invention relates to an electronic device

The present invention provides a capacitor that can make the failure mode into an open mode even when a short circuit caused by insulation breakdown occurs in a dielectric layer.

DESCRIPTION OF THE EMBODIMENTS

Figure 1:
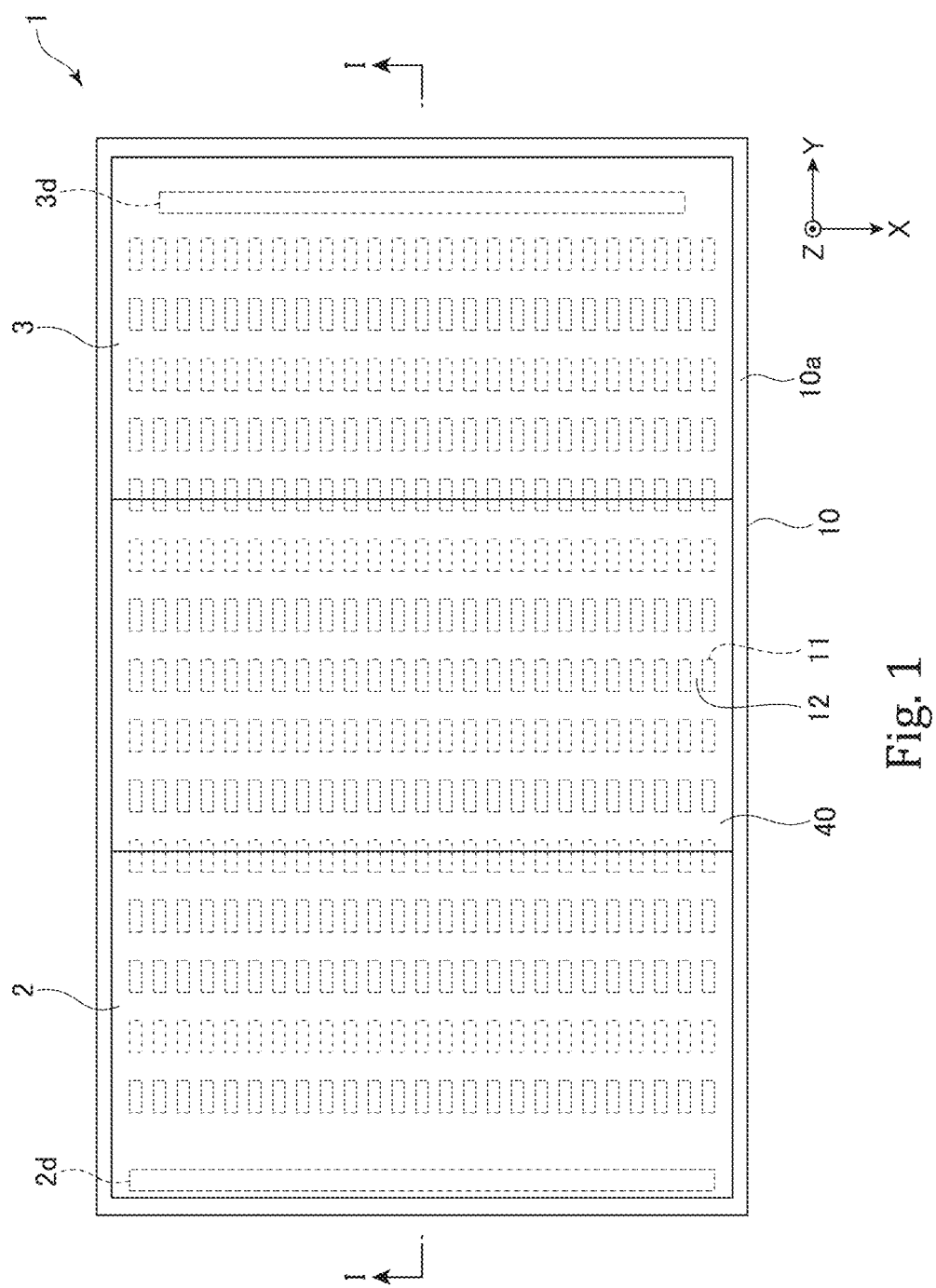
FIG. 1 is a schematic plan view of a capacitor according to one embodiment.

Various embodiments of the present invention will be described hereinafter with reference to the appended drawings. Throughout the drawings, the same components common in the drawings are denoted by the same reference numerals. It should be noted that the drawings do not necessarily appear in accurate scales for convenience of description. In particular, electrode layers and dielectric layers which will be described later are actually very thin films. However, for convenience of description, these layers are shown to have a certain thickness in the drawings such that they are visible.

Figure 2:
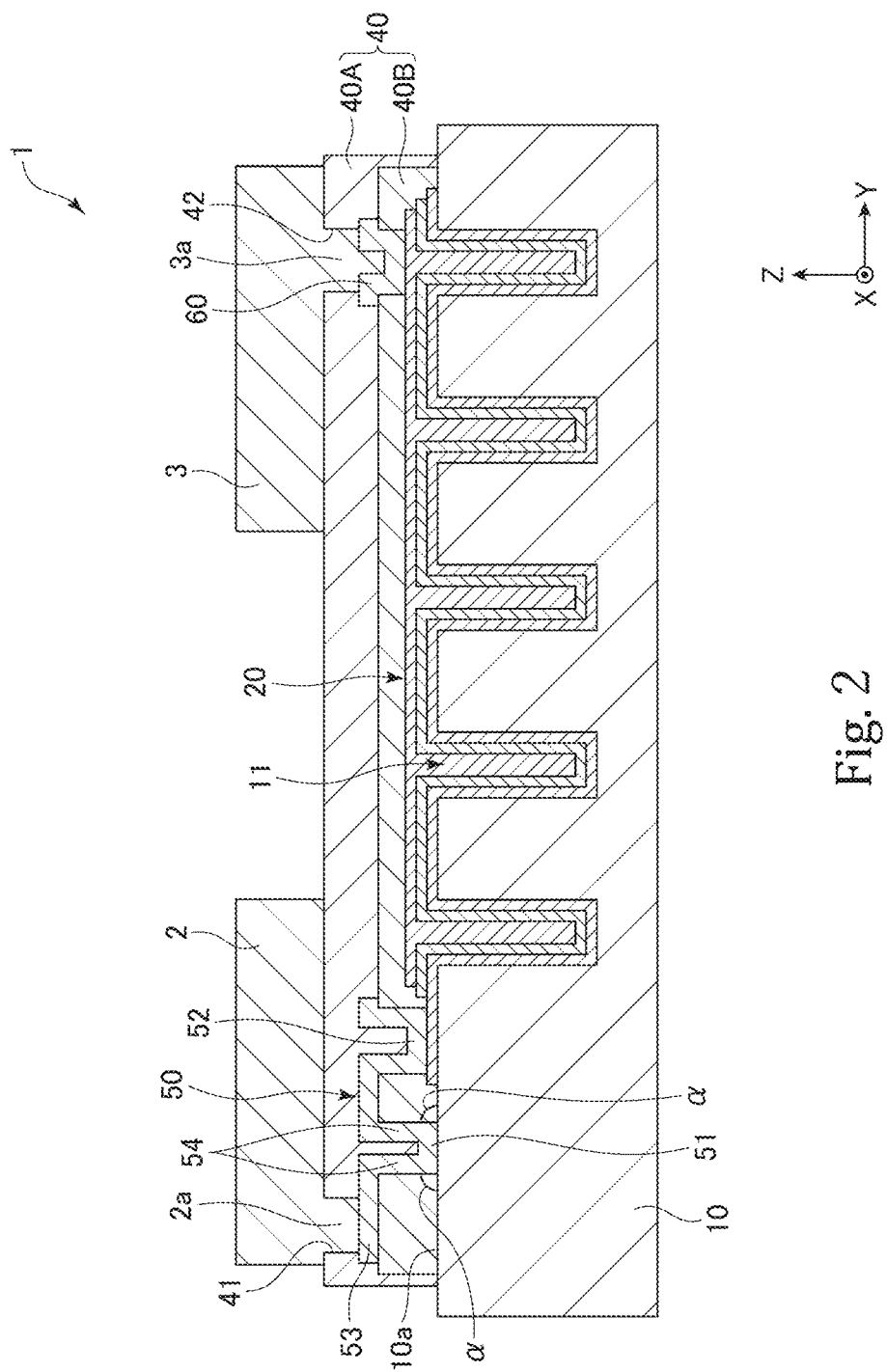
FIG. 2 is a cross sectional view schematically showing a cross section of the capacitor in FIG. 1, cut along the line I-I.
Figure 3:
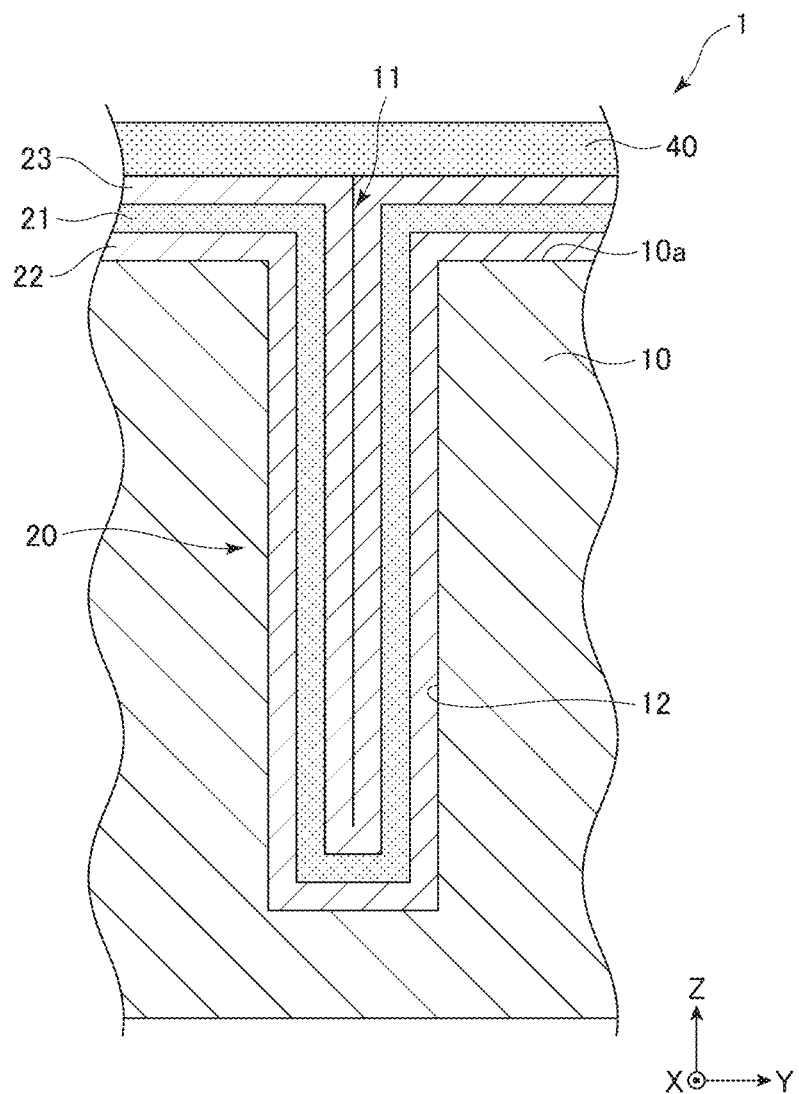
FIG. 3 is an enlarged cross-sectional view of a trench portion of the capacitor in FIG. 1.

A capacitor according to one embodiment will be described below with reference to FIGS. 1 to 3. The capacitor 1 shown in these drawings is a thin film capacitor having an MIM structure formed by a thin film formation process. In this embodiment, the capacitor 1 is a trench capacitor including a trench extending in a thickness direction of a substrate and an MIM structure disposed in the trench. The capacitor 1 may not be a trench capacitor. FIG. 1 is a schematic plan view of the capacitor 1, and FIG. 2 is a cross sectional view schematically showing a cross section of the capacitor 1, cut along the line I-I. FIG. 3 is an enlarged cross-sectional view of a trench portion of the capacitor 1.

As shown, the capacitor 1 according to one embodiment includes a substrate 10, an MIM structure 20 disposed on the substrate 10, a protective layer 40 disposed to cover the MIM structure 20, a first external electrode 2, a second external electrode 3, a connection conductor 50, and a lead-out conductor 60. The first external electrode 2 and the second external electrode 3 are disposed on an outside of the protective layer 40. The first external electrode 2 is electrically connected to an electrode layer forming the MIM structure 20 via the connection conductor 50, as will be described later. The second external electrode 3 is electrically connected to an electrode layer forming the MIM structure 20 via the lead-out conductor 60.

The capacitor 1 is mounted in a circuit board by bonding the external electrode 2 and the external electrode 3 to lands disposed on the circuit board. The circuit board can be mounted in various electronic devices. Electronic devices including a circuit board equipped with the capacitor 1 may include smartphones, mobile phones, tablets, game consoles, and any other type of electronic device to which a circuit board equipped with the capacitor 1 can be mounted.

The X direction, Y direction, and Z direction which are perpendicular to each other are shown in FIGS. 1 and 2. In this specification, the orientation and arrangement of constituent components of the capacitor 1 may be explained based on the X direction, Y direction, and Z direction in these drawings. Specifically, a "width" direction, a "length" direction, and a "thickness" direction of the capacitor 1 respectively correspond to a direction along the X axis, a direction along the Y axis, and a direction along the Z axis in FIG. 1, unless otherwise construed from the context. In this specification, when referring to a top-to-bottom direction of the capacitor 1 and its constituent components, the positive Z-axis direction is referred to as an upper direction of the capacitor 1 and the negative Z-axis direction is referred to as a lower direction of the capacitor 1, unless otherwise construed from the context.

According to one embodiment, the substrate 10 is made from a material such as Si. In one embodiment, the substrate 10 has a substantially rectangular parallelepiped shape and has a dimension of a width direction (X-axis direction), for example, from 50 µm to 5000 µm, a dimension of a length direction (Y-axis direction), for example, from 50 µm to 5000 µm, and a dimension of a thickness direction (Z-axis direction), for example, from 5 µm to 500 µm. The dimensions of the substrate 10 specifically described in this specification are only examples. The substrate 10 may have any other dimensions.

The substrate 10 has a top surface 10a, a bottom surface 10b opposite to the top surface 10a, a side surface 10c connecting the top surface 10a and the bottom surface 10b, a wall 13 defining a trench 11 which will be described later. In the embodiment shown in FIG. 1, the substrate 10 has a substantially rectangular parallelepiped shape. In this specification, the four surfaces connecting the top surface 10a and the bottom surface 10b of the substrate 10 are referred to as a side surface 10c. The substrate 10 is formed with plural trenches extending from the top surface 10a along the Z-axis direction. Each of the plural trenches 11 is formed to have a given depth in the Z-axis direction. In this specification, the Z-axis direction may be referred to as a depth direction of the trench 11. As shown in FIG. 1, each of the plural trenches 11 in a planar view has a substantially rectangular shape that is defined by a side extending in the X-axis direction and a side extending in the Y-axis direction. In the illustrated embodiment, each of the plural trenches 11 in a planar view has such a shape that the side extending in the X-axis direction is shorter than the side extending in the Y-axis direction.

In one embodiment, each of the plural trenches 11 is formed to have a high-aspect ratio in order to achieve a high capacitance per unit area. More specifically, each of the plural trenches 11 is formed to have a large ratio of the depth (a dimension in the Z-axis direction) to the width (for example, a length of the side along the X-axis direction). The width (a dimension in the X-axis direction) of each of the plural trenches 11 may be, for example, from 0.1 µm to 5 µm, and the depth (the dimension in the Z-axis direction) may be, for example, from 1 µm to 100 µm. The dimensions of the trench 11 specifically described in this specification are only examples. The trench 11 may have any other dimensions. The shape of the trench 11 in a planar view is not limited to a rectangular shape. The trench 11 may have any other shape. In one embodiment, the trench 11 has a depth (the dimension in the Z-axis direction) of 40 µm and a width (the dimension in the X-axis direction) of 1.0 µm.

The trench 11 may be formed by, for example, the following steps. A mask formed with openings corresponding to a pattern of trenches 11 is formed on a surface of an Si substrate. Following this, trenches may be formed by etching the Si substrate. The etching process for the trench 11 may be performed by a reactive ion etching process such as deep RIE (deep reactive ion etching) using the Bosch process.

Adjacent ones of the plural trenches 11 are separated by the wall 12. Specifically, the wall 12 is a part of the substrate 10 and is arranged to isolate adjacent trenches 11 from each other. The wall 12 includes plural main wall portions 13 extending in a first direction along the top surface 10a (i.e., the Y-axis direction) and plural sub-wall portions 14 extending in a second direction perpendicular to the first direction along the top surface 10a (i.e., the X-axis direction). The configuration of the wall 12 will be described in more detail later.

Next, the MIM structure 20 will be described below. As described above, the MIM structure is disposed on the substrate 10. As shown, the MIM structure 20 is disposed on the substrate 10 such that a part of the MIM structure 20 is embedded in each trench 11.

The MIM structure 20 is configured to have such a shape that follows the shapes of the top surface 10a of the substrate 10 and the trench 11. The MIM structure 20 includes a first conductive layer, a second conductive layer, and a dielectric layer between the first conductive layer and the second conductive layer. Specifically, the MIM structure 20 is a laminate in which the conductive layer and the dielectric layer are stacked one after the other. The MIM structure 20 in one embodiment includes a bottom electrode layer 22 (a first conductive layer), a dielectric layer 21 disposed on the bottom electrode layer 22, and a top electrode layer 23 (a second conductive layer) disposed on the dielectric layer 21. When referring to the top-to-bottom direction for the MIM structure 20 in this specification, a side close to the substrate 10 may be referred to as "bottom" and a side away from the substrate 10 may be referred to as "top" instead of the top-to-bottom direction in the Z-axis direction, so as to be consistent with idiomatic terms such as the bottom electrode and the top electrode. The MIM structure 20 may include two or more MIM layers. For example, in a case of two MIM layers, the MIM structure 20 includes a second MIM layer disposed on the first MIM layer composed of the bottom electrode layer 22, the dielectric layer 21, and the top electrode layer 23. For example, the second MIM layer may include a dielectric layer disposed on the top electrode layer 23 and an electrode layer disposed on this dielectric layer. In this case, the top electrode layer 23 serves as a top electrode layer of the first MIM layer and as a bottom electrode layer of the second MIM layer.

The material of the dielectric layer 21 may include barium strontium titanate (BST), barium titanate (BTO), strontium titanate (STO), zirconia ($ZrO_2$), alumina ($Al_2O_3$), hafnium oxide ($HfO_2$), titanium oxide ($TiO_2$), or any other dielectric material. The material of the dielectric layer 21 is not limited to those explicitly disclosed herein.

The dielectric layer 21 may be formed by, for example, atomic layer deposition (ALD), sputtering, CVD, vapor deposition, plating, or any other known method. The dielectric layer 21 is formed to have a film thickness of, for example, from 1 nm to 500 nm. In one embodiment, the film thickness of the dielectric layer 21 is 30 nm.

The material of the bottom electrode layer 22 and the top electrode layer 23 may include nickel (Ni), copper (Cu), palladium (Pd), platinum (Pt), silver (Ag), gold (Au), ruthenium (Ru), tungsten (W), molybdenum (Mo), titanium (Ti), conductive silicon, or any other metal material, or an alloy material including one or more of these metallic elements, or a compound of the metallic elements. In one embodiment, the material of the bottom electrode layer 22 and the top electrode layer 23 may include titanium nitride (TiN). The material of the bottom electrode layer 22 and the top electrode layer 23 is not limited to those explicitly disclosed herein.

The bottom electrode layer 22 and the top electrode layer 23 may be formed by, for example, atomic layer deposition (ALD), sputtering, vapor deposition, plating, or any other known method. In one embodiment, the bottom electrode layer 22 is formed to have a film thickness of, for example, from 1 nm to 500 nm. In one embodiment, the top electrode layer 23 is formed to have a film thickness of, for example, from 1 nm to 500 nm. In one embodiment, the film thicknesses of the bottom electrode layer 22 and the top electrode layer 23 are 30 nm respectively. The film thicknesses of the bottom electrode layer 22 and the top electrode layer 23 are 30 nm respectively. The film thickness of the bottom electrode layer 22 and the top electrode layer 23 is not limited to those explicitly disclosed herein.

Next, the protective layer 40 will be described. The protective layer 40 is disposed to cover the MIM structure 20 and the substrate 10 in order to protect the MIM structure 20 from the external environment. The protective layer 40 is disposed to protect the MIM structure 20 from, for example, mechanical damage such as external impact. In the illustrated embodiment, the protective layer 40 is composed of two thin films including a passivation film 40A and an interlayer insulating film 40B. The material of the protective layer 40 may include a resin material such as polyimide, silicon oxide ($SiO_2$), silicon nitride (SiN), silicon oxynitride (SiON), or any other insulating material. The protective layer 40 is formed by, for example, applying light-sensitive polyimide by spin coating, and exposing, developing, and curing the applied polyimide. The protective layer 40 is formed to have a film thickness of, for example, from 200 nm to 5000 nm. In one embodiment, the film thickness of the protective layer 40 is 3000 nm. The material and film thickness of the protective layer 40 is not limited to those explicitly disclosed herein.

A barrier layer (not shown) may be disposed between the protective layer 40 and the MIM structure 20 (or the substrate 10). The barrier layer is disposed mainly over the MIM structure 20 in order to improve weather resistance of the trench capacitor 1. In one embodiment, the barrier layer is disposed between the MIM structure 20 and the protective layer 40 so that moisture released from the protective layer 40 or moisture in the air can not reach the MIM structure 20. The barrier layer may be a thin film having a good barrier property against hydrogen gas. The material of the barrier layer may include alumina ($Al_2O_3$), silicon oxide ($SiO_2$), silicon oxynitride (SiON), zirconia ($ZrO_2$), or any other insulating material. The barrier layer may be formed by sputtering, CVD, or any other known method. The barrier layer is formed to have a film thickness of, for example, from 5 nm to 500 nm. In one embodiment, the film thickness of the barrier layer is 50 nm. The material and film thickness of the barrier layer is not limited to those explicitly disclosed herein.

Next, the external electrode 2 and the external electrode 3 will be described. The external electrode 2 and the external electrode 3 are disposed on an upper side of the protective layer 40 to be spaced apart from each other in the Y-axis direction. The external electrode 2 and the external electrode 3 are formed by, for example, applying a conductive paste including metal material onto an exterior of the protective layer 40. The external electrode 2 and the external electrode 3 may be formed by plating. The material of the external electrode 2 and the external electrode 3 may include copper (Cu), nickel (Ni), tin (Sn), palladium (Pd), platinum (Pt), silver (Ag), gold (Au), or any other metal material, or an alloy material including one or more of these metallic elements. The external electrode 2 and the external electrode 3 may be formed with at least one of a solder-barrier layer and a solder-leakage layer as needed.

A groove 41 is disposed near the end of the protective layer 40 in the negative Y-axis direction, and a groove 42 is disposed near the end of the protective layer 40 in the positive Y-axis direction. The groove 41 and the groove 42 are both disposed to extend in the X-axis direction and pass through the protective layer 40 in the Z-axis direction. The lead-out electrode 2a is disposed in the groove 41, and the lead-out electrode 3a is disposed in the groove 42.

An upper end of the lead-out electrode 2a is connected to the external electrode 2, and a lower end of the lead-out electrode 2a is connected to the connection conductor 50, which will be described later, to be electrically connected to the bottom electrode layer 22 of the MIM structure 20. An upper end of the lead-out electrode 3a is connected to the external electrode 3, and a lower end of the lead-out electrode 3a is connected to the top electrode layer 23 of the MIM structure 20 via the lead-out conductor 60.

The material of the lead-out electrodes 2a, 3a may include copper (Cu), nickel (Ni), tin (Sn), palladium (Pd), platinum (Pt), silver (Ag), gold (Au), or any other metal material, or an alloy material including one or more of these metallic elements. The lead-out electrodes 2a, 3a may be formed by, for example, vapor deposition, sputtering, plating, or any other known method.

Figure 4:
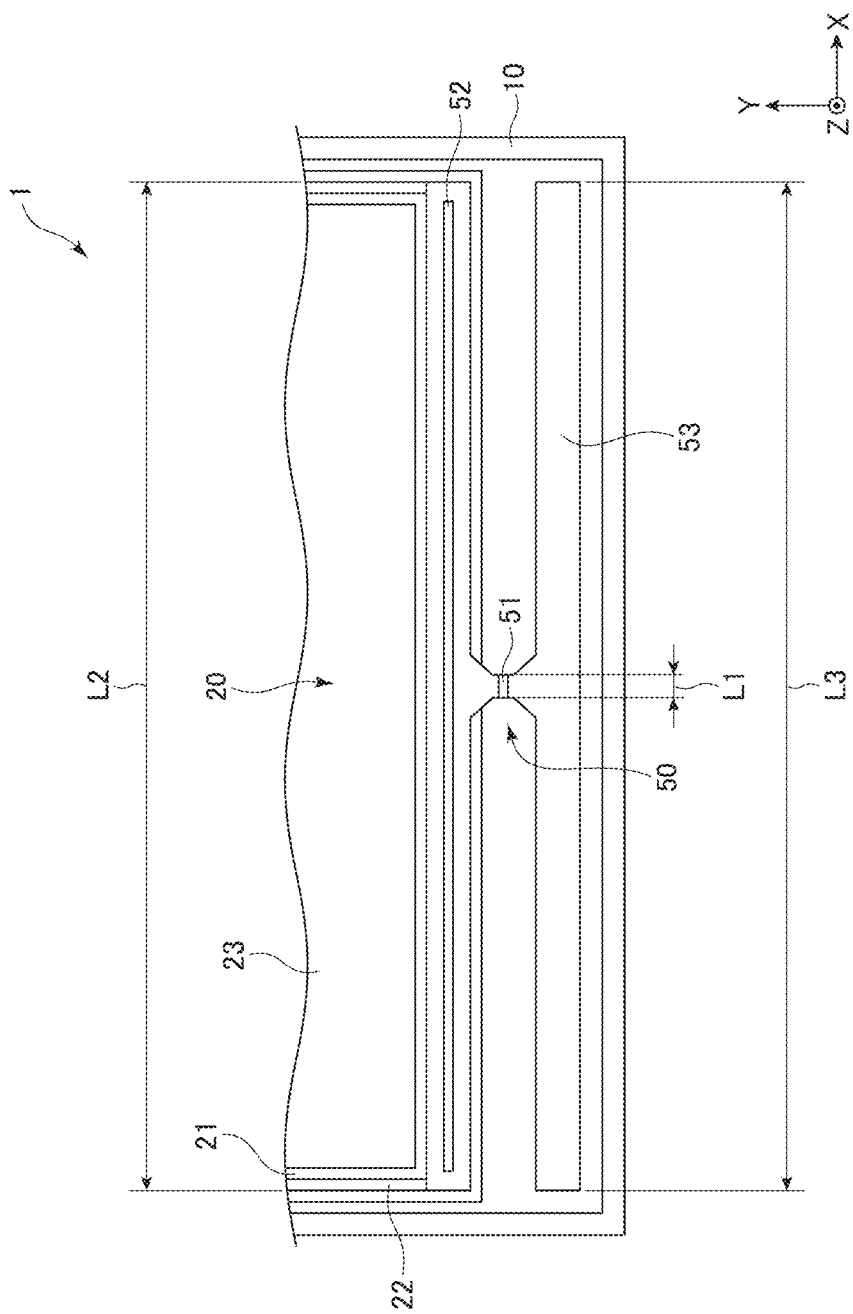
FIG. 4 is a top plan view schematically showing a connection conductor of the capacitor in FIG. 1.

Next, the connection conductor 50 will be described with reference to FIG. 4. FIG. 4 is a top plan view schematically showing the connection conductor 50. As shown in FIG. 2 and FIG. 4, the connection conductor 50 electrically connects the bottom electrode layer 22 of the MIM structure 20 to the first external electrode 2. More specifically, the connection conductor 50 is electrically connected to the first external electrode 2 via the lead-out electrode 2a. The connection conductor 50 is disposed between the passivation film 40A and the interlayer insulating film 40B of the protective layer 40 below the first external electrode 2 and has a shape following the shape of the interlayer insulating film 40B. The connection conductor 50 includes a first contact portion (contact portion) 51 contacting the substrate 10, a second contact portion 52 contacting the bottom electrode layer 22, a third contact portion 53 contacting the lead-out electrode 2a connected to the external electrode 2, and plural connection portions 54 extending along a side wall of an opening of the interlayer insulating film 40B. The first contact portion 51, the second contact portion 52, and the third contact portion 53 extend along the top surface 10a of the substrate 10. Each of the plural connection portions 54 extends in the Z-axis direction. As viewed from the top of the capacitor 1, each of the second contact portion 52 and the third contact portion 53 has a rectangular shape having long sides in the X-axis direction.

In the illustrated embodiment, as viewed from the top of the capacitor 1 (that is, as viewed in the Z-axis direction), the dimension L2 of the second contact portion 52 in the X-axis direction is the same as the dimension of the bottom electrode layer 22 in the X-axis direction. The dimension L3 of the third contact portion 53 in the X-axis direction is the same as the dimension of the lead-out electrode 2a in the X-axis direction. In the illustrated embodiment, the dimension of the bottom electrode layer 22 in the X-axis direction is the same as the dimension of the lead-out electrode 2a in the X-axis direction. Between the second contact portion 52 and the first contact portion 51 and between the third contact portion 53 and the first contact portion 51, the dimension of the connection conductor 50 in the X-axis direction is gradually smaller toward the first contact portion 51. The dimension of the connection conductor 50 in the X-axis direction is smallest at the first contact portion 51. Specifically, in the illustrated embodiment, the dimension of the first contact portion L1<L2=L3. With this structure, a cross section of the connection conductor 50 in a direction perpendicular to a current pathway from the bottom electrode layer 22 to the first external electrode 2 becomes smallest at the first contact portion 51. Accordingly, resistance gets highest at the first contact portion 51, thereby causing the first contact portion 51 to be easily heated. As a result, the connection conductor 50 can be reliably disconnected at the first contact portion 51. The angle a between the connection portions 54 extending from the first contact portion 51 and the top surface 10a of the substrate 10 is 90° or less. With the angle a being 90° or less, it is possible to prevent the connection conductor 50 from being unexpectedly disconnected.

The connection conductor 50 may be composed of a conductive material (a second conductive material) having a lower melting point than a conductive material (a first conductive material) composing the bottom electrode layer 22 and the top electrode layer 23. As one example, the connection conductor 50 may be composed of aluminum. The material composing the connection conductor 50 is not limited to aluminum and may be copper or the like instead. The second contact portion 52 of the connection conductor 50 may be connected to the top electrode layer 23. The connection conductor 50 may be electrically connected to the MIM structure 20 and the second external electrode 3. In this case, the third contact portion 53 of the connection conductor 50 is connected to the lead-out electrode 3a. The location of the connection conductor 50 is not limited to below the first external electrode 2 and may be changed as needed. For example, in a case where the connection conductor 50 electrically connects the MIM structure 20 to the second external electrode 3, the connection conductor 50 may be disposed below the second external electrode 3.

The lead-out conductor 60 lies between the top electrode layer 23 and the lead-out electrode 3a. The top electrode layer 23 and the second external electrode 3 are electrically connected to each other by the lead-out conductor 60. The lead-out conductor 60 is disposed so as not to contact the substrate 10. The lead-out conductor 60 is composed of a conductive material (a third conductive material) having a lower melting point than the conductive material (a first conductive material) composing the bottom electrode layer 22 and the top electrode layer 23. As one example, the lead-out conductor 60 may be composed of aluminum. The material (the third conductive material) composing the lead-out conductor 60 may be the same as or different from the material (the second conductive material) composing the connection conductor 50. In a case where the second contact portion 52 of the connection conductor 50 is connected to the top electrode layer 23, the lead-out conductor 60 may be connected to the bottom electrode layer 22. In a case where the connection conductor 50 electrically connects the MIM structure 20 to the second external electrode 3, the lead-out conductor 60 may lie between the MIM structure 20 and the lead-out electrode 2a and may be electrically connected to the first external electrode 2.

Figure 5A:
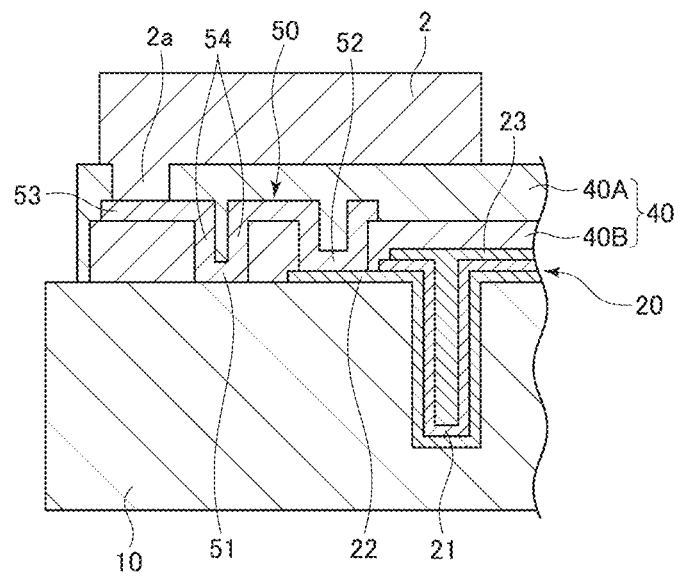
FIG. 5a is a cross sectional view schematically showing the connection conductor before a short circuit occurs.
Figure 5B:
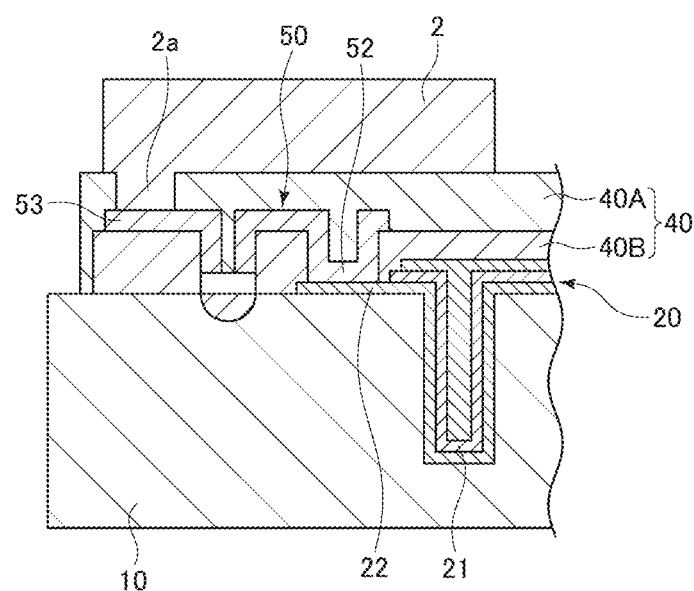
FIG. 5b is a cross sectional view schematically showing the connection conductor after a short circuit has occurred.
Figure 6:
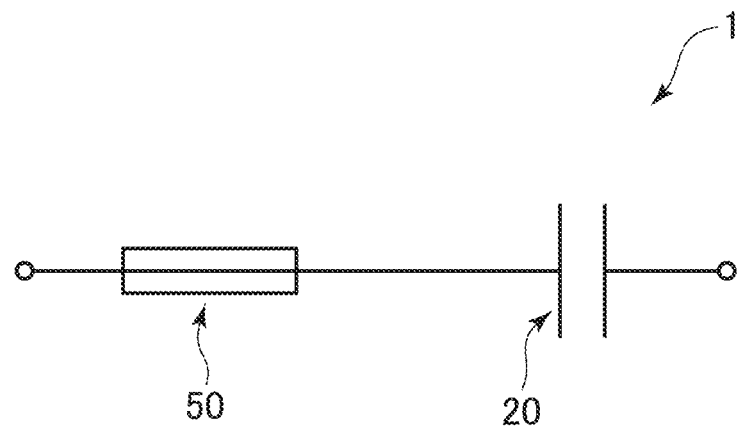
FIG. 6 is a view of an equivalent circuit showing an internal structure of the capacitor in FIG. 1.

The effect of the connection conductor 50 will now be described with reference to FIG. 5a and FIG. 5b. FIG. 5a is a cross sectional view schematically showing the connection conductor 50 before a short circuit occurs. FIG. 5b is a cross sectional view schematically showing the connection conductor 50 after a short circuit has occurred. When a failure such as a short circuit occurs in the MIM structure 20 in the capacitor 1, a current that is not applied under ordinary circumstances, namely an excess current, is applied to constituent components of a circuit connected to the capacitor 1. Such application of a current that is not expected under ordinary circumstances causes malfunctioning or destruction of the circuit. In order to prevent unwanted application of a current to the other circuit, it is desirable that the capacitor 1 has an open mode as a failure mode. As shown in FIG. 5a, in a state in which no short circuit occurs in the MIM structure 20, the first external electrode 2 and the MIM structure 20 are electrically connected to each other by the connection conductor 50, and the capacitor 1 is operably connected to an external circuit (not shown). Upon occurrence of a short circuit in the MIM structure 20, an excess current flows through the connection conductor 50, thereby causing the connection conductor 50 to be heated and melted. At this time, the first contact portion 51 of the connection conductor 50 contacts the substrate 10, and therefore, the melted material (i.e., the second conductive material) of the connection conductor 50 spreads in the substrate 10 near the first contact portion 51. As a result, as shown in FIG. 5b, the connection conductor 50 is disconnected near the first contact portion 51, so that the electrical connection between the MIM structure 20 and the first external electrode 2 is broken. In this manner, the connection conductor 50 serves as a fuse. FIG. 6 shows an equivalent circuit showing the internal structure of the capacitor 1. Accordingly, it is possible to direct a failure mode with a failure caused by insulation breakdown to an open mode, which can prevent malfunctioning or destruction of an external circuit.

Figure 7A:
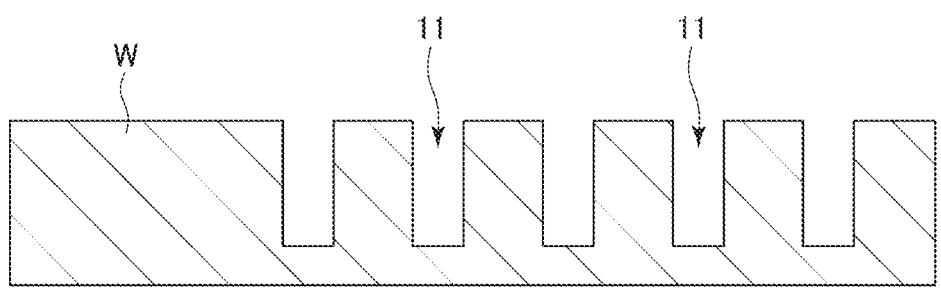
FIG. 7a is a view for explaining a method of manufacturing the capacitor in FIG. 1.

Next, a method for manufacturing the capacitor 1 will be described with reference to FIG. 7a to FIG. 7f. First, an Si wafer W to be the substrate 10 is provided, and a mask corresponding to a pattern of trenches 11 is formed on a top of the Si wafer W. Next, as shown in FIG. 7a, the Si wafer W is etched to form plural trenches 11. The etching of the Si wafer W is, for example, dry etching using the Bosch process.

Figure 7B:
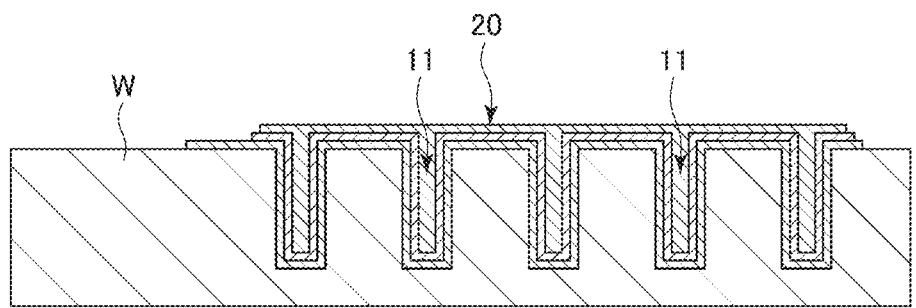
FIG. 7b is a view for explaining the method of manufacturing the capacitor in FIG. 1.

Following this, the mask is removed from the Si wafer W, and the MIM structure 20 including the bottom electrode layer 22, the dielectric layer 21, and the top electrode layer 23 is formed along the top of the Si wafer W. As a result, as shown in FIG. 7b, the MIM structure 20 is formed on the top of the Si wafer W and in the trenches 11. For example, the dielectric layer 21 may be formed of zirconia, and the bottom electrode layer 22 and the top electrode layer 23 may be formed of TiN. Each layer of the MIM structure 20 (i.e., the bottom electrode layer 22, the dielectric layer 21, and the top electrode layer 23) may be formed by the ALD method. The material of the dielectric layer 22 is not limited to zirconia, and the material of the bottom electrode layer 22 and the top electrode layer 23 is not limited to TiN. The bottom electrode layer 22, the dielectric layer 21, and the top electrode layer 23 may be formed by any known method other than the ALD method.

Figure 7C:
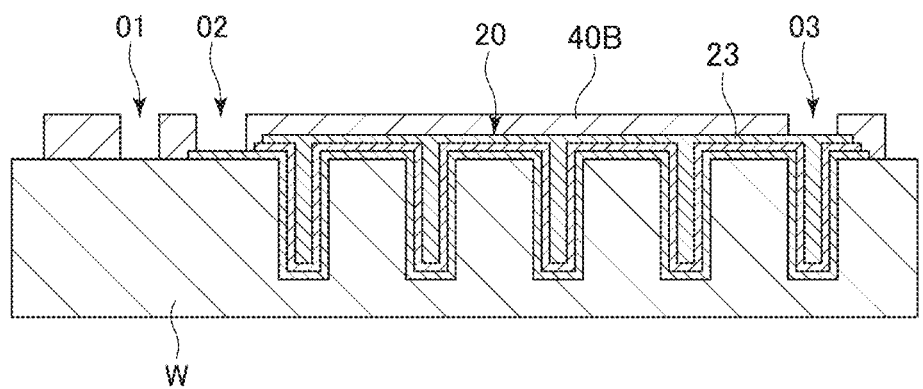
FIG. 7c is a view for explaining the method of manufacturing the capacitor in FIG. 1.

Next, as shown in FIG. 7c, the interlayer insulating film 40B, which will be a part of the protective layer 40, is formed on the MIM structure 20 and the Si wafer W. At this time, the interlayer insulating film 40B is subjected to patterning to form an opening O1 to expose the Si wafer W (i.e., the substrate 10), an opening O2 to expose the bottom electrode layer 22, and an opening O3 to expose the top electrode layer 23.

Figure 7D:
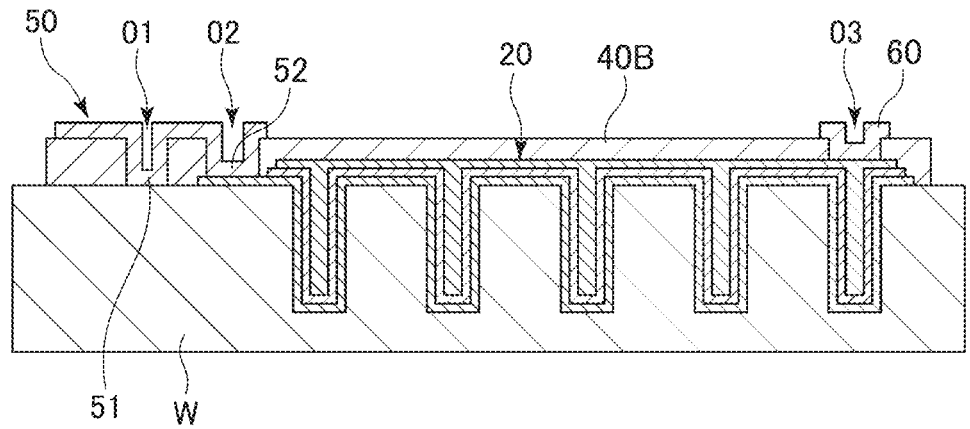
FIG. 7d is a view for explaining the method of manufacturing the capacitor in FIG. 1.

Then, a thin film (i.e., the second conductive material) composing the connection conductor 50 is formed along the interlayer insulating film 40B and is subjected to patterning. As a result of the process, as shown in FIG. 7d, the connection conductor 50 and the lead-out conductor 60 are formed. The first contact portion 51 of the connection conductor 50 is formed in the opening O1, and the second contact portion 52 of the connection conductor 50 is formed in the opening O2. The lead-out conductor 60 is formed at a position corresponding to the opening O3.

Figure 7E:
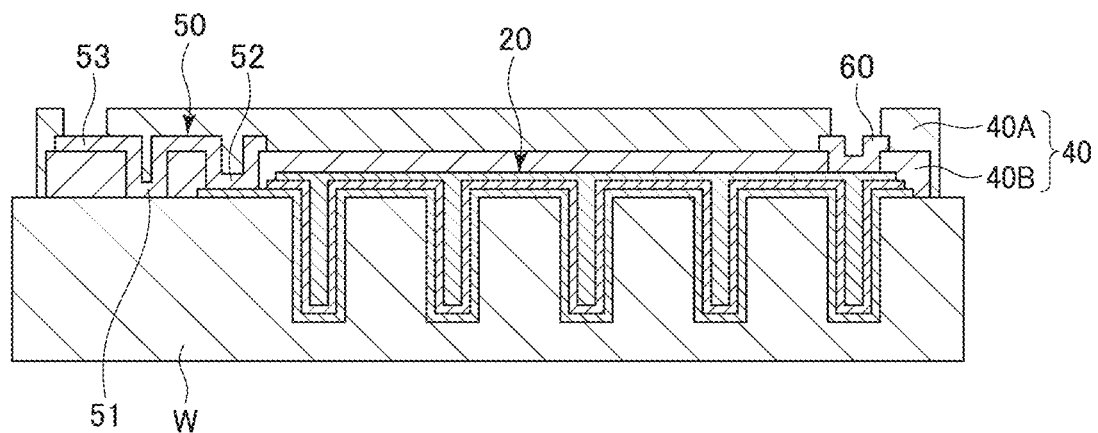
FIG. 7e is a view for explaining the method of manufacturing the capacitor in FIG. 1.

Next, as shown in FIG. 7e, the passivation film 40A is formed on the interlayer insulating film 40B. At this time, a groove is formed near each of the Y-axis-direction ends of the part of the passivation film 40A above the MIM structure 20. The connection conductor 50 is exposed out of one groove, and the lead-out conductor 60 is exposed out of the other groove. As a result of the process, the protective layer 40 including the passivation film 40A and the interlayer insulating film 40B is formed.

Figure 7F:
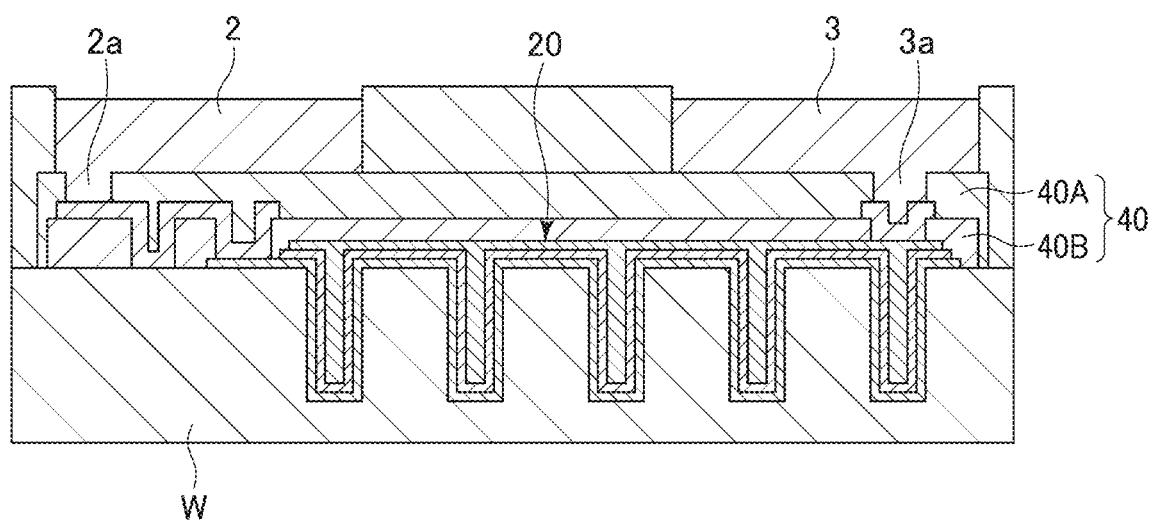
FIG. 7f is a view for explaining the method of manufacturing the capacitor in FIG. 1.

Next, the lead-out electrodes 2a, 3a are formed in the grooves by plating or any other similar method, and the first external electrode 2 and the second external electrode 3 are formed on a surface of the protective layer 40 (see FIG. 7f). Last, the wafer is divided into individual pieces. By the above-described process, plural capacitors 1 can be obtained.

As described above, the capacitor 1 according to one embodiment of the present invention includes the connection conductor 50, and the connection conductor 50 includes the first contact portion 51 contacting the substrate 10. When a short circuit caused by insulation breakdown occurs in the MIM structure 20, the connection conductor 50 is heated and melted by an excess current. Because the connection conductor 50 includes the first contact portion 51, the melted material of the connection conductor 50 spreads in the substrate 10 near the first contact portion 51. This allows the connection conductor 50 to be disconnected near the first contact portion 51, thereby breaking the electrical connection between the MIM structure 20 and the first external electrode 2. Accordingly, it is possible to make the failure mode into an open mode even when a short circuit caused by insulation breakdown occurs.

The connection conductor 50 of the capacitor 1 is composed of a conductive material (the second conductive material) having a lower melting point than a conductive material (the first conductive material) composing the bottom electrode layer 22 and the top electrode layer 23. Therefore, when a short circuit caused by insulation breakdown occurs in the MIM structure 20, the connection conductor 50 is easy to be melted by an excess current. Accordingly, it is possible to disconnect the connection conductor 50 near the first contact portion 51 in a more reliable manner and make the failure mode into an open mode in a more reliable manner even when a short circuit caused by insulation breakdown occurs.

The conductive material (the second conductive material) composing the connection conductor 50 is, for example, aluminum. Since aluminum is easy to spread in the Si substrate 10, when a short circuit caused by insulation breakdown occurs in the MIM structure 20, the connection conductor 50 can be more reliably disconnected near the first contact portion 51.

Plural trenches 11 are disposed on a surface of the substrate 10, and the MIM structure 20 is disposed on the substrate 10 so as to be embedded in at least one of the plural trenches 11. Accordingly, the electrostatic capacitance can be increased while the dimension of the capacitor 1 is kept.

A cross section of the connection conductor 50 in a direction perpendicular to a current pathway from the bottom electrode layer 22 to the first external electrode 2 is smallest at the first contact portion 51. With this structure, the first contact portion 51 is easy to be heated when an excess current flows through the connection conductor 50. Therefore, the second conductive material is easy to be melted particularly at the first contact portion 51, thereby allowing the connection conductor 50 to be disconnected near the first contact portion 51 in a more reliable manner. Accordingly, it is possible to make the failure mode into an open mode in a more reliable manner even when a short circuit caused by insulation breakdown occurs.

Figure 8:
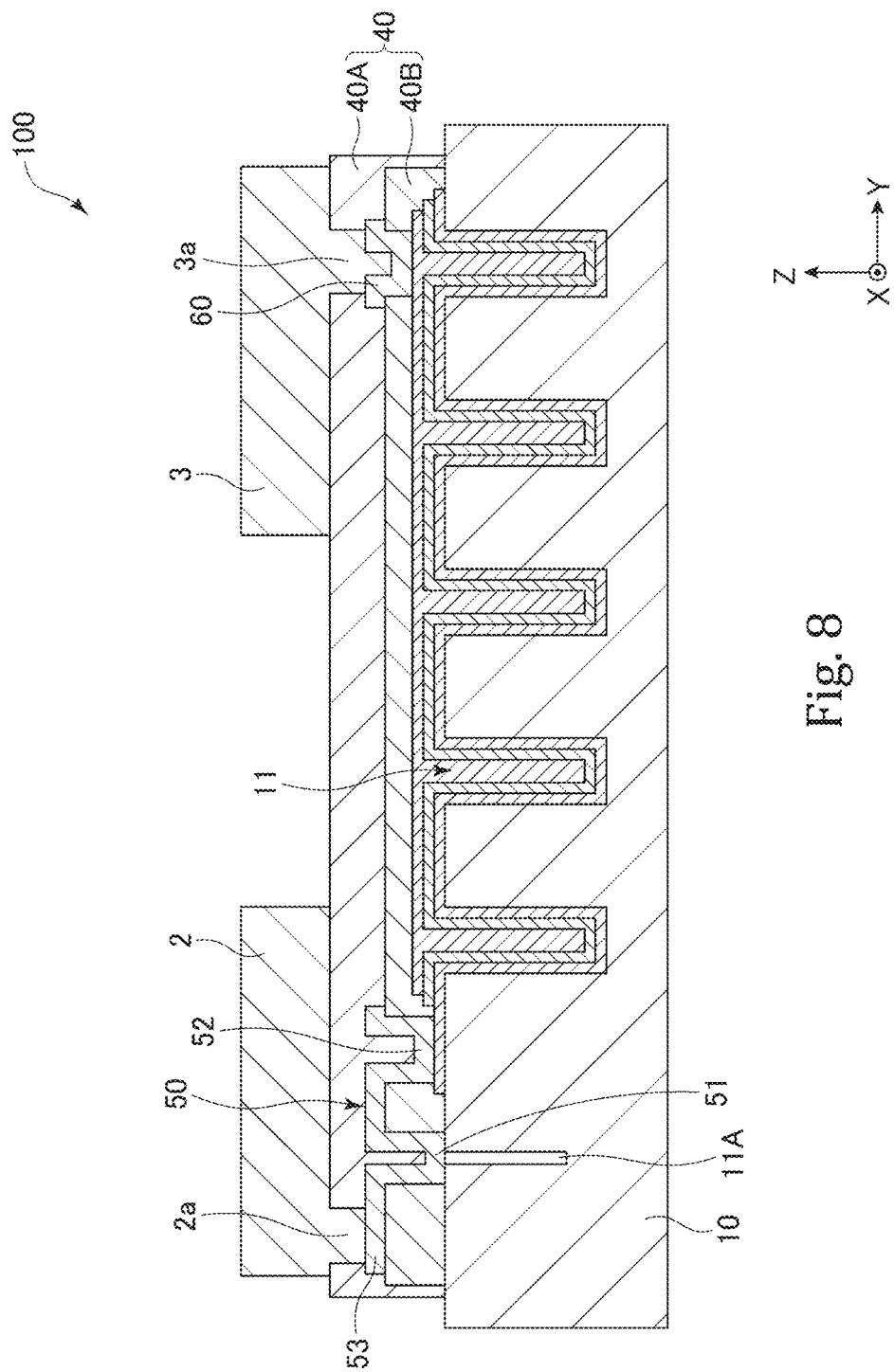
FIG. 8 shows a cross sectional view of a capacitor according to another embodiment.

Next, a capacitor 100 according to another embodiment will be described with reference to FIG. 8. FIG. 8 is a cross sectional view showing the capacitor 100 according to another embodiment. As shown in FIG. 8, the capacitor 100 according to another embodiment includes a connection conductor 50 connecting between the bottom electrode layer 22 and the first external electrode 2, similarly to the capacitor 1. The capacitor 100 according to another embodiment differs from the capacitor 1 in having an empty trench 11A in which an MIM structure 20 is not embedded. At least one empty trench 11A is disposed on the substrate 10. The empty trench 11A is at least partially covered by the first contact portion 51 of the connection conductor 50. The empty trench 11A may be entirely covered by the first contact portion 51 of the connection conductor 50. A depth-direction dimension of the empty trench 11A is smaller than a depth-direction dimension of the trench 11 in which the MIM structure 20 is embedded. As viewed from the top of the capacitor 100, the empty trench 11A has a smaller opening space than the trench 11.

According to the above-described capacitor 100, not only the material (i.e., the second conductive material) of the connection conductor 50 melted when an excess current flows through the connection conductor 50 spreads into the substrate 10, but also the second conductive material flows into the empty trench 11A. This allows the connection conductor 50 to be disconnected near the first contact portion 51 in a more reliable and rapid manner. Accordingly, it is possible to direct the failure mode with a failure due to insulation breakdown to an open mode in a more reliable manner.

Next, a capacitor 200 according to still another embodiment will be described with reference to FIG. 9 and FIG. 10.

Figure 9:
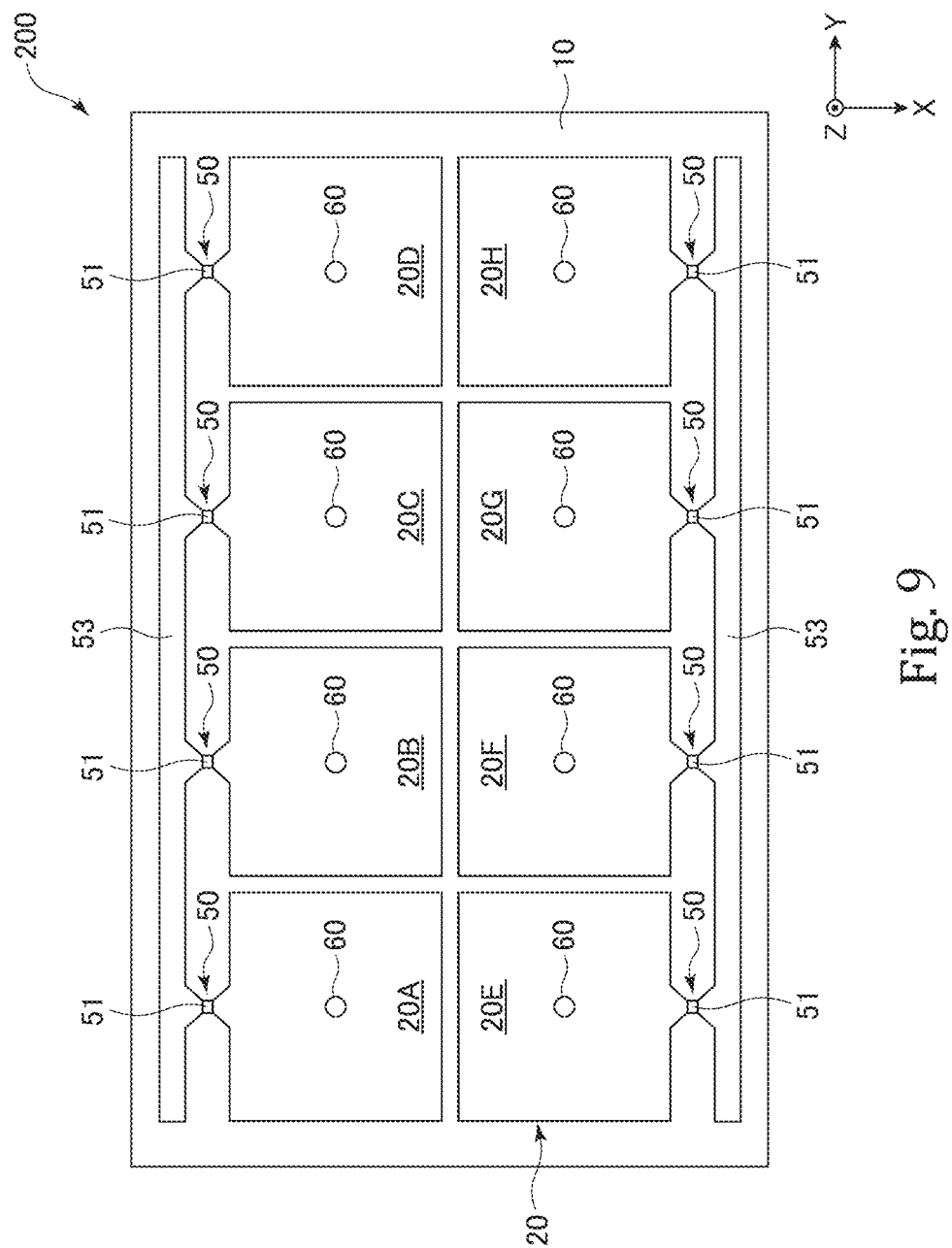
FIG. 9 is a top plan view showing a capacitor according to still another embodiment.
Figure 10:
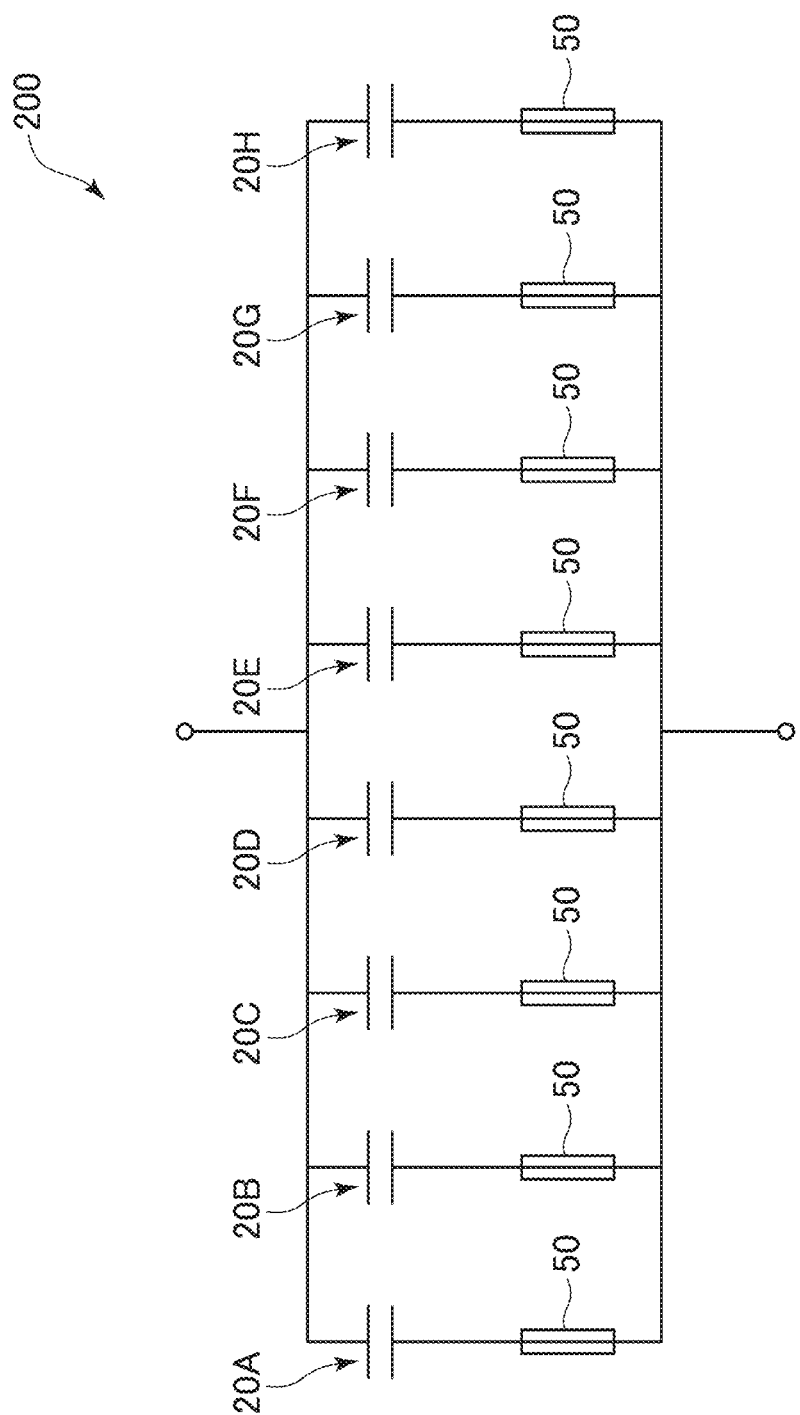
FIG. 10 is a view of an equivalent circuit showing an internal structure of the capacitor in FIG. 9.

FIG. 9 is a top plan view showing the capacitor 200 according to the still another embodiment. FIG. 10 is a view of an equivalent circuit showing an internal structure of the capacitor 200 in FIG. 9. In FIG. 9, the first external electrode, the second external electrode, the protective layer and the like are not shown, and the MIM structure and the connection conductor are shown in solid lines.

As shown in FIG. 9, the MIM structure 20 of the capacitor 200 has plural sections. In the illustrated embodiment, the MIM structure 20 is divided into eight sections 20A to 20H. Each of the sections 20A to 20H creates an electrostatic capacitance as a single capacitor. The capacitor 200 includes plural connection conductors 50. The connection conductors 50 is disposed at each of the plural sections 20A to 20H. One end of the connection conductor 50 is connected to the bottom electrode layer 22 of a corresponding section, and the other end of the connection conductor 50 is connected to the first external electrode 2. The capacitor 200 also includes plural lead-out conductors 60 connected to the top electrode layers 23 of the corresponding sections respectively. The plural lead-out conductors 60 are connected to the second external electrode. With this structure, the plural sections 20A to 20H of the capacitor 200 are connected in parallel to each other as shown in FIG. 10. In the illustrated embodiment, third contact portions 53 of the connection conductors 50 connected to the sections arranged in a long-side direction (i.e., the Y-axis direction) of the capacitor 200 are continuous in a form of a single electrode. The electrode composed of the continuous third contact portions 53 of the plural connection conductors 50 may be extended along a short-side direction of the capacitor 200.

According to the above-described capacitor 200, the connection conductor 50 is disconnected similarly to the capacitor 1 when a short circuit caused by insulation breakdown occurs in the MIM structure 20. This allows an electrical connection between the MIM structure 20 and the first external electrode 2 to be broken. Accordingly, it is possible to direct the failure mode with a failure due to insulation breakdown to an open mode. Furthermore, only the connection conductor 50 disposed at the section having a short circuit is disconnected, and therefore, variation in the electrostatic capacitance of the capacitor 200 due to the failure can be reduced.

Figure 11:
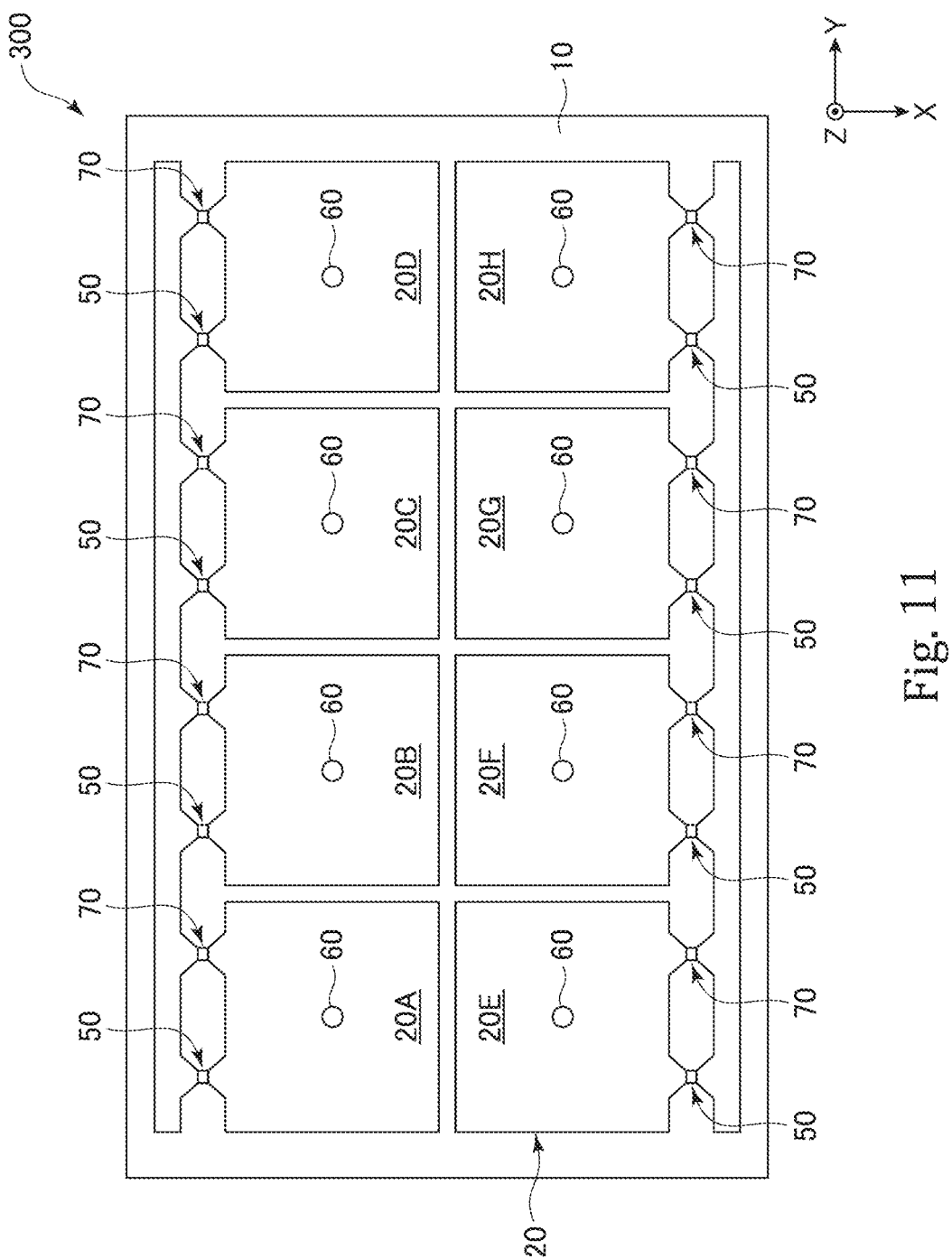
FIG. 11 is a top plan view showing a capacitor according to still another embodiment.
Figure 12:
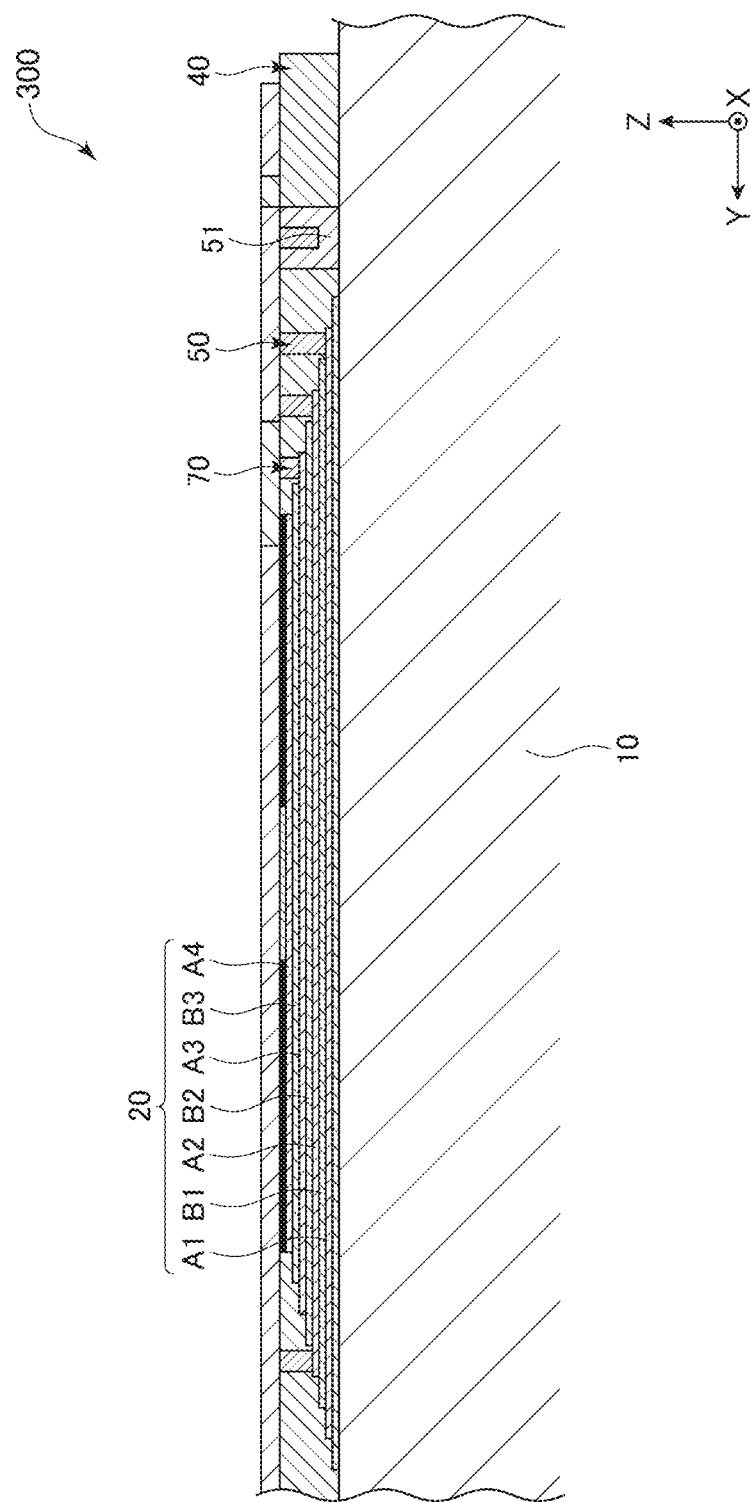
FIG. 12 is a cross sectional view schematically showing the capacitor in FIG. 11.
Figure 13:
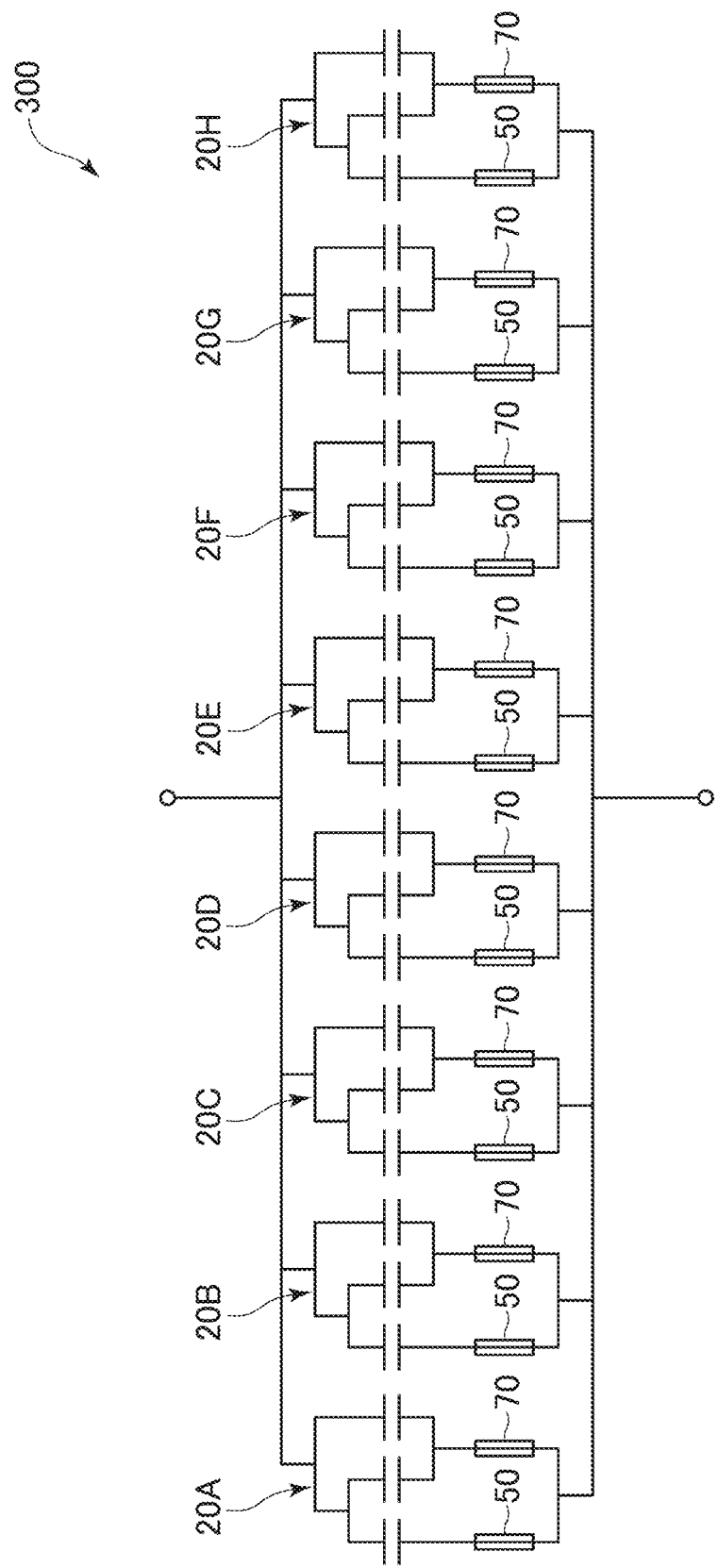
FIG. 13 is a view of an equivalent circuit showing an internal structure of the capacitor in FIG. 11.

Next, a capacitor 300 according to still another embodiment will be described with reference to FIG. 11 to FIG. 13. FIG. 11 is a top plan view showing the capacitor 300 according to the still another embodiment. FIG. 12 is a cross sectional view schematically showing the capacitor in FIG. 11. FIG. 13 is a view of an equivalent circuit showing an internal structure of the capacitor in FIG. 11. In FIG. 11, the first external electrode, the second external electrode, the protective layer and the like are not shown. The MIM structure and the connection conductor are shown in solid lines.

As shown in FIG. 11, the MIM structure 20 of the capacitor 300 is divided into plural sections 20A to 20H similarly to the capacitor 200. The MIM structure 20 of the capacitor 300 includes plural dielectric layers, and each of the sections 20A to 20H includes another connection conductor 70 connected to an electrode layer different from the connection conductor 50. The other connection conductor 70 includes a first contact portion contacting the substrate 10 likewise the connection conductor 50 and is configured to be disconnected when a short circuit occurs to break the electrical connection between the MIM structure 20 and the first external electrode. In the illustrated embodiment, as shown in FIG. 11, the MIM structure 20 is a seven-layered structure including a first electrode layer A1, a first dielectric layer B1, a second electrode layer A2, a second dielectric layer B2, a third electrode layer A3, a third dielectric layer B3, and a fourth electrode layer A4, in order from bottom to top. The connection conductor 50 is connected to the first electrode layer A1, and the other connection conductor 70 is connected to the third electrode layer A3. FIG. 12 shows a cross section of the capacitor 300 along the X-Z plane passing through the first contact portion 51 of the connection conductor 50. In FIG. 12, the first contact portion of the other connection conductor 70 is hidden on the positive-Y-axis-direction side of the first contact portion 51 of the connection conductor 50. The connection conductor 50 and the connection conductor 70 are disposed at each of the plural sections 20A to 20H and are connected to the first external electrode 2. With this structure, the equivalent circuit of the internal structure of the capacitor 300 is as shown in FIG. 13. The number of electrode layers and dielectric layers included in the MIM structure 20 is not specifically limited. In a case where the MIM structure 20 includes more electrode layers and dielectric layers, another connection conductor may be provided in addition to the connection conductor 70. A connection conductor may be disposed in each of the electrode layers included in the MIM structure 20. In the illustrated embodiment, the MIM structure 20 of the capacitor 300 is divided into plural sections, but the MIM structure 20 of the capacitor 300 may not be divided into sections.

According to the above-described capacitor 300, the connection conductor 50 and/or the connection conductor 70 are/is disconnected likewise the capacitor 1 when a short circuit caused by insulation breakdown occurs in the MIM structure 20. This allows an electrical connection between the MIM structure 20 and the first external electrode 2 to be broken. Accordingly, it is possible to direct the failure mode with a failure due to insulation breakdown to an open mode. Furthermore, according to the capacitor 300, only the connection conductor connected to the electrode layer having a short circuit is disconnected, and therefore, variation in the electrostatic capacitance of the capacitor due to the failure can be reduced.

The dimensions, material, and arrangement of the elements described herein are not limited to those explicitly described for the embodiments. The elements are susceptible of modifications for desired dimensions, materials, and arrangements within the scope of the present invention. The elements other than those explicitly described herein can be added to the described embodiments; and part of the elements described for the embodiments can be omitted.

REFERENCE NUMERALS

1: Capacitor, 10: Substrate, 10a: Top surface, 11: Trench, 11A: Empty trench, 20: MIM structure, 50, 70: Connection conductor, 51: First contact portion (contact portion), 60: Lead-out conductor.

What is claimed is:
1. A capacitor comprising:
an Si substrate;
an MIM structure disposed on the Si substrate, the MIM structure including a first dielectric layer, a first electrode layer disposed on one side of the first dielectric layer and composed of a first conductive material, and a second electrode layer disposed on the other side of the first dielectric layer;
a first external electrode disposed on the Si substrate;

a second external electrode disposed on the Si substrate; and a connection conductor connecting between the first electrode layer and the first external electrode, the connection conductor including a contact portion and plural connecting portions, one connecting portion being connected to one end of the contact portion and another connecting portion being connected to the other end of the contact portion, wherein, in a cross section of the connection conductor, the contact portion and plural connecting portions form a U-shape such that (i) the contact portion directly contacts surface of the Si substrate and (ii) both the plural connecting portions extend in a perpendicular direction from the contact portion and from the surface of the Si substrate towards the first external electrode, wherein plural trenches are disposed on the surface of the Si substrate, and the MIM structure is disposed on the Si substrate so as to be embedded in at least one of the plural trenches, wherein the plural trenches include at least one empty trench in which the MIM structure is not embedded, and the at least one empty trench is at least partially covered by the contact portion, and wherein a depth-direction dimension of the at least one empty trench is smaller than a depth-direction dimension of another trench in which the MIM structure is embedded.

2. The capacitor according to claim 1, wherein the connection conductor is composed of a second conductive material having a lower melting point than the first conductive material.

3. The capacitor according to claim 2, wherein the second conductive material is aluminum.

4. The capacitor according to claim 1, wherein a cross section of the connection conductor in a direction perpendicular to a current pathway from the first electrode layer to the first external electrode is smallest at the contact portion.

5. The capacitor according to claim 1, wherein a depth-direction dimension of the at least one empty trench is smaller than a depth-direction dimension of another trench in which the MIM structure is embedded.

6. The capacitor according to claim 1, further comprising a lead-out conductor connecting between the second electrode layer and the second external electrode, the lead-out conductor composed of a third conductive material having a lower melting point than the first conductive material.

7. The capacitor according to claim 6, wherein the lead-out conductor is disposed without contacting the Si substrate.

8. The capacitor according to claim 1, wherein
the connection conductor is provided in plural,
the MIM structure includes plural sections connected in parallel to each other, and
the connection conductor is disposed at each of the plural sections.

9. The capacitor according to claim 1, wherein
the MIM structure further includes a second dielectric layer disposed on the second electrode layer and a third electrode layer disposed on the second dielectric layer, and
the capacitor further comprises another connection conductor connecting between the third electrode layer and the first external electrode, the another connection conductor composed of a second conductive material having a lower melting point than a material composing the third electrode layer.

10. A circuit board comprising the capacitor according to claim 1.

11. An electronic device comprising the circuit board according to claim 10.

12. A capacitor comprising:
an Si substrate;
an MIM structure disposed on the Si substrate, the MIM structure including a first dielectric layer, a first electrode layer disposed on one side of the first dielectric layer and composed of a first conductive material, and a second electrode layer disposed on the other side of the first dielectric layer;
a first external electrode disposed on the Si substrate;
a second external electrode disposed on the Si substrate; and
a connection conductor connecting between the first electrode layer and the first external electrode, the connection conductor including a contact portion contacting the Si substrate
wherein plural trenches are disposed on a surface of the Si substrate, and the MIM structure is disposed on the Si substrate so as to be embedded in at least one of the plural trenches,
wherein the plural trenches include at least one empty trench in which the MIM structure is not embedded, and
wherein the at least one empty trench is at least partially covered by the contact portion.

13. A capacitor comprising:
an Si substrate;
an MIM structure disposed on the Si substrate, the MIM structure including a first dielectric layer, a first electrode layer disposed on one side of the first dielectric layer and composed of a first conductive material, and a second electrode layer disposed on the other side of the first dielectric layer;
a first external electrode disposed on the Si substrate;
a second external electrode disposed on the Si substrate; and
a connection conductor connecting between the first electrode layer and the first external electrode, the connection conductor including a contact portion contacting the Si substrate,
wherein plural trenches are disposed on a surface of the Si substrate, the MIM structure is disposed on the Si substrate so as to be embedded in at least one of the plural trenches,
wherein the plural trenches include at least one empty trench in which the MIM structure is not embedded,
wherein the at least one empty trench is at least partially covered by the contact portion, and
wherein a depth-direction dimension of the at least one empty trench is smaller than a depth-direction dimension of another trench in which the MIM structure is embedded.

14. A circuit board comprising the capacitor according to claim 12.

* * * * *